United States Patent [19]

Lin

[11] Patent Number: 4,791,075
[45] Date of Patent: Dec. 13, 1988

[54] PROCESS FOR MAKING A HERMETIC LOW COST PIN GRID ARRAY PACKAGE

[75] Inventor: Paul T. Lin, Austin, Tex.

[73] Assignee: Motorola, Inc., Schaumburg, Ill.

[21] Appl. No.: 104,478

[22] Filed: Oct. 5, 1987

[51] Int. Cl.⁴ ............................................. H01L 23/48
[52] U.S. Cl. ................... 437/209; 437/215; 29/850; 174/50.51; 174/52.5; 337/74; 361/404
[58] Field of Search ............... 437/209, 214, 217, 215, 437/220; 174/52 PE, 52 S, 52 H; 357/70; 361/404

[56] References Cited

U.S. PATENT DOCUMENTS

| | | | |
|---|---|---|---|
| 3,634,600 | 1/1972 | Griffin et al. | 174/52 S |
| 3,673,309 | 6/1972 | Dalmasso et al. | 174/52 PE |
| 4,382,327 | 5/1983 | Bardens et al. | 174/52 PE |
| 4,423,435 | 12/1983 | Test, II | 357/65 |
| 4,493,143 | 1/1985 | Maier | 174/52 H |
| 4,656,442 | 4/1987 | Hayakawa | 174/52 FP |

Primary Examiner—Brian E. Hearn
Assistant Examiner—Beverly A. Pawlikowski
Attorney, Agent, or Firm—John A. Fisher; Jeffrey Van Myers

[57] ABSTRACT

A process for making hermetic, low cost pin grid array (PGA) semiconductor die packages. The process involves die bonding a semiconductor die or integrated circuit chip to a substrate having an interconnect or metallization pattern thereon. The die is electrically connected to the pattern and then the die and the inner bonds are hermetically sealed inside a cap that is smaller than the substrate so that the ends of the metallization pattern are exposed. The leads are then electrically connected, such as by solder or other technique to the exposed ends of the pattern.

19 Claims, 2 Drawing Sheets

PROCESS FOR MAKING A HERMETIC LOW COST PIN GRID ARRAY PACKAGE

FIELD OF THE INVENTION

The invention relates to processes for packaging semiconductor die such as integrated circuits, and more particularly relates to packaging semiconductor die in pin grid array packages.

BACKGROUND OF THE INVENTION

Pin grid array (PGA) packages are well known in the art of packaging semiconductor die, particularly integrated circuits. Very large scale integrated (VLSI) circuits tend to employ PGAs for their package because the PGA provides many more leads than are available in the conventional dual in-line package (DIP) or plastic leaded chip carrier (PLCC). The DIP has leads only along two sides of the package, and the PLCC has leads around four sides of the package, in contrast to the PGA which has a large number of leads perpendicularly extending from a flat package body for a "bed of nails" appearance. Thus, VLSI integrated circuit chips which carry a relatively large number of bonding pads are often placed in PGAs which have a large number of pins relative to the package size, or the space it occupies or "footprint" on the printed circuit board (PCB) that it will ultimately be mounted upon.

Typically, a ceramic substrate is employed for the PGA package. The substrate will have a central region therein for bonding the semiconductor die thereto. A conductive pattern of metal traces runs from the central die bonding region to the pins that perpendicularly pierce the substrate and that are brazed to the substrate. The pins are brazed to the ceramic substrate before the semiconductor die is mounted thereon. The bonding pads of the die are wire bonded to the conductive pattern. A cap is then hermetically sealed to the substrate by glass or frit sealing techniques covering the entire surface of the substrate including the die, the conductive pattern, the wire bonds and the tops of the pins.

One of the advantages of the PGA package described above is that the semiconductor die or integrated circuit chip is hermetically sealed into the package. However, one of the major disadvantages of the PGA package is that they are very expensive and can cost as much as or more than the semiconductor die itself. This is particularly true if a multilayer ceramic substrate is used that employs layers of interconnecting patterns between ceramic layers. Another expensive part of the PGA package is that the conductive patterns therein are gold and the pins that are brazed in before the die bonding step are gold as well. This extensive use of gold drives up the cost of the package. Another problem with the conventional PGA is that the testing of the part is performed after the die is assembled in this expensive package. If the die tests bad, then not only is the die scrapped, but the expensive package must be scrapped as well.

Attempts have been made to reduce the cost of ceramic PGAs while still providing hermeticity for the die. One approach has been to use copper pins instead of gold plated copper pins. However, a problem with this approach is that after the copper pins are silver brazed to the substrate, intermetallic shorting connections form between the pins. These dendritic growths occur upon the application of bias under humid conditions.

SUMMARY OF THE INVENTION

Accordingly, it is an object of the present invention to provide a low cost pin grid array (PGA) for packaging semiconductor die, including VLSI circuit chips.

Another object of the present invention is to provide a process for packaging semiconductor die into a PGA package that minimizes some of the expensive tests of the PGA assembly process.

It is another object of the present invention to provide a process for packaging semiconductor die in a PGA package that permits the testing of the die prior to completion of the PGA packaging process.

Yet another object the invention is to provide a process by which the package leads may be of a different metal than the solder or the traces, yet minimizes the formation of intermetallic connections.

Additionally, it is an object of the invention to provide a PGA package where only the die and wire bond area are hermetically sealed, to permit top-side testing of the IC while the PGA is secured to the printed circuit (PC) board. Inability to test the conventional PGA after it is mounted to the PC board is a disadvantage.

Still a further object of the present invention is to provide a PGA assembly process which will permit the use of a single layer ceramic substrate. In particular, pressed ceramic can be used. Pressed ceramic is particularly advantageous because the metallization patterns placed thereon are not subject to shrinkage since the ceramic will not change dimensions.

In carrying out these and other objects of the invention, there is provided, in one form, a process for the assembling of a hermetic low cost pin grid array semiconductor die package that starts by providing a ceramic substrate having a central die bonding area, a plurality of lead holes at the periphery of the substrate piercing the substrate and a conductive pattern comprising a plurality of conductive material traces extending from the central die bonding area at their proximal ends to the lead holes at their distal ends. First, a semiconductor die having a plurality of bonding pads thereon is bonded to the central die bonding area. The bonding pads of the semiconductor die are electrically connected to the proximal ends of the conductive material traces. A cap is next hermetically sealed onto the ceramic substrate, and the cap covers the semiconductor die and the proximal ends of the conductive material traces, leaving exposed the distal ends of the traces and the lead holes. Finally, leads placed in the lead holes are electrically affixed to the distal ends of the conductive material traces.

It should be noted that the illustrations are not to scale and that the thicknesses of some of the elements are exaggerated relative to each other for clarity.

DETAILED DESCRIPTION OF THE INVENTION

It has been discovered that a hermetic pin grid array may be produced with some cost savings by rearranging the steps of the process and using a different structure.

Figure 1:
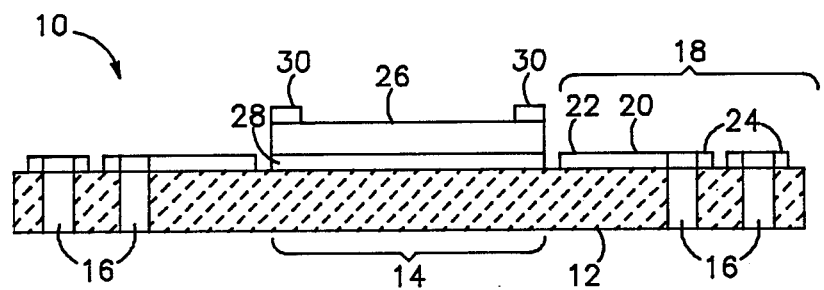
FIG. 1 is a cross-section schematic illustration of a single-layer ceramic substrate employed in the process of the invention after a semiconductor die has been bonded thereto.

Shown in FIG. 1 is a hermetic low cost PGA 10 under construction, which inlcudes a PGA substrate 12 having a die bonding area 14, a plurality of lead holes 16 at the periphery of the substrate 12. The lead holes 16 pierce the substrate 12 and also pierce a conductive pattern 18 that involves a plurality of conductive material traces 20 that run from their proximal ends 22 near the die bonding area 14 to the lead holes 16 at their distal ends 24. The conductive pattern 18 is simply the collection of all of the conductive material traces 20 that frame the die bonding area 14 and provide connection from the die to the exterior leads of the package 10.

The PGA substrate 12 may be of any insulative material but in one embodiment is ceramic to provide a known hermetic package material. A ceramic substrate 12 could be silicon carbide, alumina, or aluminum nitride. It is anticipated that one important embodiment of the invention will use a single layer ceramic substrate 12, that is, the package 10 will not have multiple ceramic layers and multiple conductive patterns therebetween. Alumina has often been used as the ceramic material in multi-layer PGAs, but since one embodiment of the present invention does not require lamination, it would be much easier to use ceramics other than standard alumina, such as aluminum nitride in the present process.

The metallized interconnection or conductive pattern 18 and the lead pins, to be described later, have to be able to withstand a glass sealing heat cycle and still provide a solder wettable surface. For example, if prefastened copper alloy pins are used the pins may have nickel and gold plated thereto to provide a solder wettable surface. For terminal patterns 18, a gold, thick film paste can be used. The conditioning of the conductive material traces 20 could be done in a manner similar to those used in wire bonding post metallizations. The conductive pattern 18 may be any other suitable material as well, such as, for example, gold, aluminum, high temperature solder, etc.

An optional structure would be to cover conductive pattern 18 with glass or another insulative material. Of course, openings would have to be cut for the proximal ends 22 and teh distal ends 24 of the traces 20, although the bulk of the traces 20 would be covered by the insulative material. Such an insulative layer, which is not shown in the drawings, would be beneficial in that the subsequent solder bonds would be contained by the layer, which would additionally help prevent the growth of intermetallic shorts.

FIG. 1 shows the results of the first step of the inventive process, namely that of bonding a semiconductor die 26 to the ceramic substrate 12 in the central die bonding area 14 using an adhesive 28. The adhesive 28 may be conductive, such as a metallic, e.g. solder, gold-tin eutectic, etc., or may be nonconductive, such as a glass or epoxy. Semiconductor die or integrated circuit chip 26 has on its surface a plurality of bonding pads 30, which are typically, but not necessarily, near the periphery of the die 26 as shown in FIG. 1.

Figure 2:
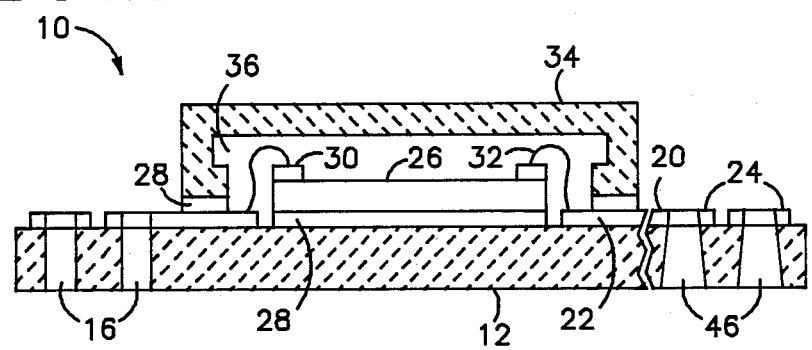
FIG. 2 is a cross-section schematic illustration of the assembly of FIG. 1 after the die has been wire bonded and a cap hermetically sealed over the die and the wire bonds.

Next, as shown in FIG. 2, the bonding pads 30 are electrically connected to the proximal ends 22 of the conductive material traces 20 by wire bonds 32. However, it should be understood that bonding pads 30 may be connected to the proximal ends of the traces 20 by other means such as tape automated bonding (TAB) foil or by placing bonding bumps, such as gold or high temperature solder, on the surface of the die, flipping the die over and bonding it mechanically and electrically directly to the distal ends 24 of the pattern 18 in the well known "flip chip" technique. Wire bonds 32 are illustrated herein as simply one embodiment. The particular technique of electrically connecting the bonding pads 30 with the traces 20 is not limiting on the invention.

Subsequently, a cap 34 is sealed onto the package 10 by known glass reflow or frit sealing techniques to achieve hermeticity. The cap 34 should have an interior cavity 36 to accommodate the bulk of the chip 26 and the bonding structures 32, and should bond over the conductive material traces 20 at some point intermediate the distal ends 24 and the proximal ends 22, leaving exposed the distal ends 24 of the traces 20. Lead holes 16 remain exposed as well. The cap 34 may be ceramic, such as any of the ceramic materials mentioned for the substrate 12, or the cap 34 may be metal, as long as a hermetic seal is provided.

Figure 3:
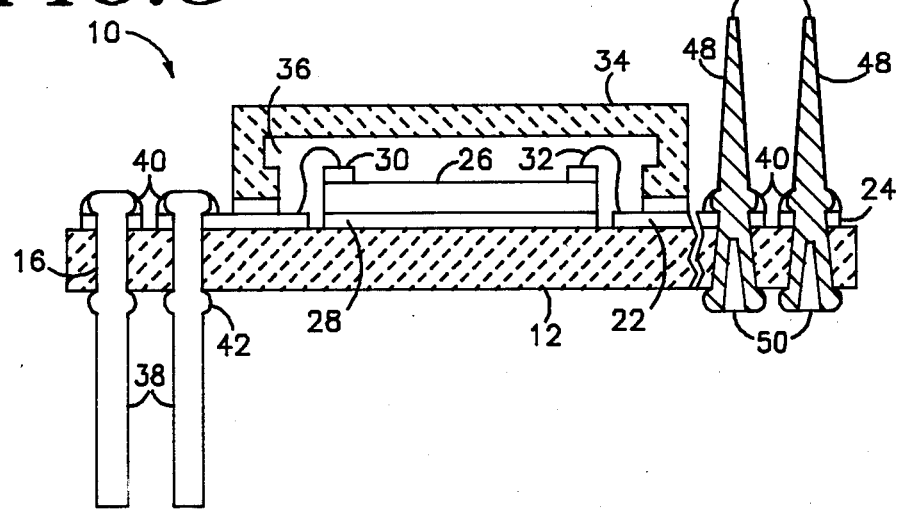
FIG. 3 is a cross-section schematic illustration of the completed hermetic low cost in pin grid array made in accordance with the process of this invention.

As shown in FIG. 3, leads 38 placed in lead holes 16 are electrically affixed or connected to the distal ends 24 of the conductive material traces 20 by any known means, although solder bonds 40 are illustrated in FIG. 3. Leads 38 may be pins, such as gold or copper pins that are first mechanically formed or swaged into holes 16. This mechanical fitting may form bulges 42 on the pins 38, over and above the lead holes 16 to keep the pins 38 in place. In accordance with the process of the invention, the pins 38 may be placed into the holes 16 at any time in the procedure, before the die 26 bonding or after the cap 34 sealing. However, one skilled in the art will appreciate that the partially assembled package 10 shown in FIG. 2 could be tested, using the traces 20 for contact, and if the tests showed the die 26 to be defective, the partially assembled package could be scrapped without incurring the additional costs of the leads and of attaching the leads. These costs savings could be significant if gold plated leads are employed.

Besides metal leads, solder columns could also be attached to the lead holes 16 to provide a way to surface mount the hermetic, low cost PGA. The solder columns could be attached to the substrate 12 or to the printed circuit board first depending upon the inspection or testing requirements. Solder columns are well known in the art.

Nevertheless, what is important is that the final electrical connection of the distal ends 24 of traces 20 is made after the chip 26 is hermetically sealed inside cap 34. If metal pins 38 are used, then a solder bond 40 needs to be provided to ensure electrical contact of the pins 38 to the distal ends 24.

Thus, the process of the present invention provides a low cost, hermetic PGA 10 by its particular process sequence and the use of a cap 34 that covers only the die 26 and the proximal ends 22 of the conductive pattern 18. Employing a cap of limited lateral extent permits testing the part from above after it has been mounted into the board. If copper pins 38 are used, intermetallic formations between the copper pins 38 and the solder connections are minimized since the soldering of the pins 38 occurs at the end of the assembly processing, and preassembled substrates 12 with copper pins 38 that are waiting for assembly may have an opportunity to form undesirable shorting intermetallic connections. Further, as noted above, the leads, such as pins, solder columns, etc., need only be attached to parts which electrically tested to be good. Additionally, if one chooses to use a pressed ceramic for the substrate 12, no shrinkage of the conductive pattern 18 would occur. Thus, one can anticipate that a higher wire bond yield can result, especially with high pin count parts and high density packages.

Using a cap 34 of limited lateral extent permits the use of another optional configuration as shown in FIGS. 2 and 3. Instead of employing the lead holes 16 having the straight-walled configuration shown at the left side in FIGS. 1 through 3, tapered lead holes 46 may be employed as seen at the right side of FIG. 2. It may be understood that the tapered lead holes 46 may be tapered either up or down. Tapered lead holes 46 accommodate tapered socket leads 48 seen in FIG. 3. Such leads 48 are swaged and soldered into holes 46 in a fashion similar to the placement of leads 38 in lead holes 16.

Socket leads 48 possess socket holes 50 which are adapted to accept the ends 52 of tapered socket leads 48 from another low cost PGA 10. In this fashion, PGAs 10 may be stacked so as to occupy a smaller volume. Such stacking may be useful in the adding of additional memory to the circuit, for providing connection of a co-processor or paged memory management unit to a microprocessor, etc. If the tapered leads 48 are designed to depend from the sme side of the substrate 12 as the die 26, as shown in FIG. 3, additional volume may be conserved.

Figure 4:
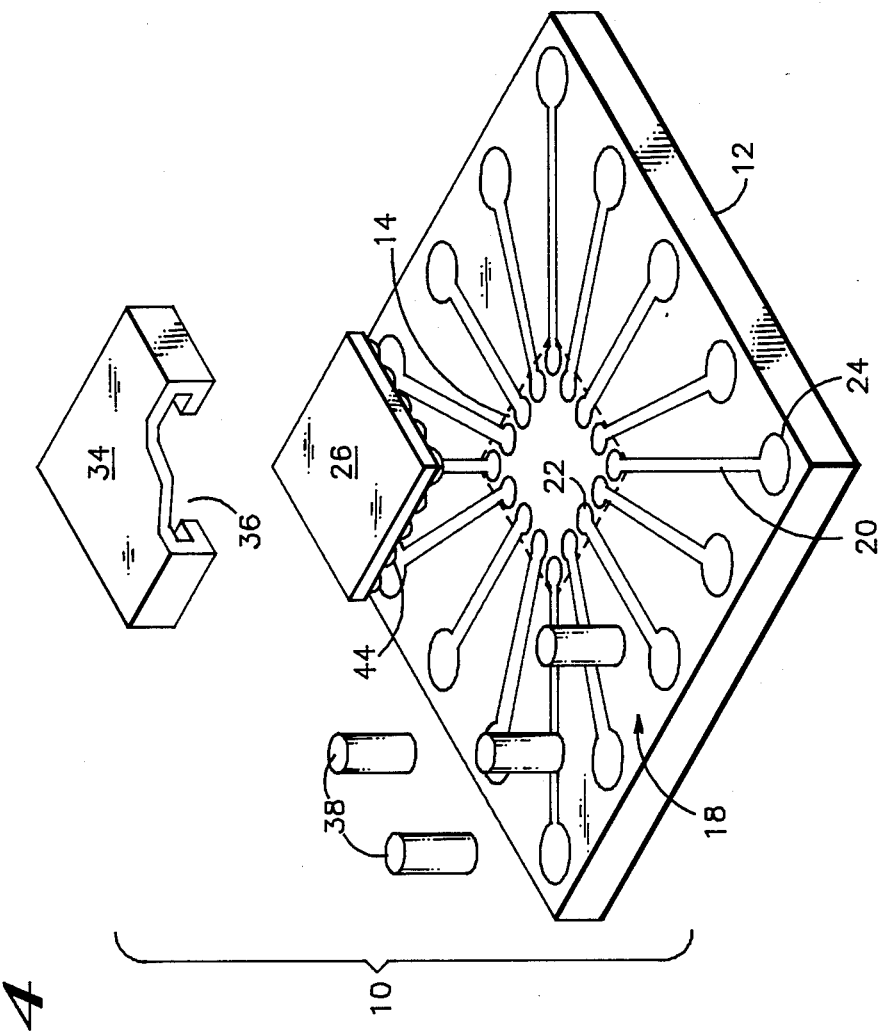
FIG. 4 is an exploded view of another embodiment of the hermetic low cost PGA of the invention employing flip chip bonding techniques.

Shown in FIG. 4 is an exploded perspective view of an alternate embodiment of the hermetic low cost PGA package 10 of the present invention illustrating a substrate 12 of a single ceramic layer having a conductive pattern 18 thereon. As explained earlier, the conductive pattern 18 is made up of a plurality of conductive material traces 20. It will be appreciated that the number of traces 20 shown in FIG. 4 is considerably less than the actual number used in a PGA 10 for the sake of clear illustration.

In this embodiment, the conductive material traces 20 on the surface of the substrate 12 have their proximal ends 22 within the die bonding area 14. This arrangement permits semiconductor die 26 to be mounted in inverse position "flip-chip" style directly onto the proximal ends 22 of the conductive material traces 20. The bonding pads 30 on the circuit surface of the die 26, on the underside as viewed in FIG. 4, must have bonding bumps 44 thereon to provide the direct bond of the die 26 to the proximal ends 22. As the bonding pads 30 are directly connected to the proximal ends 22, the die 26 is also mounted to the substrate 12. The hermetic sealing of the cap 34 is carried out similarly to the procedure described with respect to FIG. 2.

Another feature of the FIG. 4 embodiment is the absence of lead holes 16 in the distal ends 24 of the conductive metal traces 20. instead lead 38, which may be solder columns, are directly mounted or bonded to the distal ends 24, which may be a form of bonding pad. In this embodiment, the entire hermetic, low cost PGA 10 may be inverted and surface mounted to a PCB directly using the lead 38 using techniques similar to the "flip chip" method.

I claim:
1. A process for the assembling of a hermetic low cost pin grid array (PGA) semiconductor die package comprising the steps of:
   providing an insulative substrate having a central die bonding area and a periphery, and a conductive pattern comprising a plurality of conductive material traces extending from the central die bonding area at their proximal ends to the periphery at their distal ends;
   bonding a semiconductor die having a plurality of bonding pads thereon to the central die bonding area;
   electrically connecting the bonding pads of the semiconductor die to the proximal ends of the conductive material traces;
   hermetically sealing a cap onto the insulative substrate wherein the cap covers the semiconductor die and the proximal ends of the conductive material traces, leaving exposed the distal ends of the traces; and
   affixing leads to the distal ends of the conductive material traces after the cap is hermetically sealed to the substrate, whereby the leads are in a position perpendicular to the conductive material traces, in the absence of a plastic encapsulation step.

2. The process of claim 1 wherein the leads are metal pins.

3. The process of claim 1 wherein the leads are solder columns.

4. The process of claim 1 wherein the insulative substrate is of a single layer substrate.

5. The process of claim 1 wherein the electrical connection of the bonding pads of the semiconductor die to the proximal ends of the conductive material traces is achieved by wire bonding.

6. The process of claim 1 wherein the electrical connection of the bonding pads of the semiconductor to the proximal ends of the conductive material traces is accomplished at the same time as the bonding of the semiconductor die to the central die bonding area by means of flip chip bonding.

7. The process of claim 1 wherein the affixing of the leads to the distal ends of the conductive material traces is achieved by soldering.

8. A process for the assembling of a hermetic low cost pin grid array (PGA) semiconductor die package comprising the steps of:
   providing a ceramic substrate having a central die bonding area, a plurality of lead holes at the periphery of the substrate piercing the substrate and a conductive pattern comprising a plurality of conductive material traces extending from the central die bonding area at their proximal ends to the lead holes at their distal ends;
   bonding a semiconductor die having a plurality of bonding pads thereon to the central die bonding area;
   electrically connecting the bonding pads of the semiconductor die to the proximal ends of the conductive material traces;
   hermetically sealing a cap onto the ceramic substrate wherein the cap covers the semiconductor die and the proximal ends of the conductive material traces, leaving exposed the distal ends of the traces and the lead holes;
   placing leads in the lead holes in a position perpendicular to the conductive metal traces; and electrically affixing leads placed in the lead holes in the distal ends of the conductive material traces after the cap is hermetically sealed to the substrate, in the absence of a plastic encapsulation step.

9. The process of claim 8 wherein the leads are metal pins.

10. The process of claim 9 wherein the leads are mechanically swaged into the lead holes prior to the semiconductor die bonding step.

11. The process of claim 9 wherein the leads are mechanically swaged into the lead holes after the cap is hermetically sealed onto the ceramic substrate.

12. The process of claim 8 wherein the leads are solder columns which are attached to the lead holes and the distal ends of the conductive material after the cap is hermetically sealed onto the ceramic substrate.

13. The process of claim 8 wherein the ceramic substrate is of a single layer substrate.

14. The process of claim 8 wherein the electrical connection of the bonding pads of the semiconductor die to the proximal ends of the conductive material traces is achieved by wire bonding.

15. The process of claim 8 wherein the electrical connection of the bonding pads of the semiconductor to the proximal ends of the conductive material traces is accomplished at the same time as the bonding of the semiconductor die to the central die bonding area by means of flip chip bonding.

16. The process of claim 8 wherein the affixing of the leads to the distal ends of the conductive material traces is achieved by soldering.

17. A process for the assembling of a hermetic low cost pin grid array (PGA) semiconductor die package comprising the steps of:
providing a ceramic substrate having a central die bonding area, a plurality of lead holes at the periphery of the substrate piercing the substrate and a conductive pattern comprising a plurality of conductive material traces extending from the central die bonding area at their proximal ends to the lead holes at their distal ends;
bonding a semiconductor die having a plurality of bonding pads thereon to the central die bonding area;
electrically connecting the bonding pads of the semiconductor die to the proximal ends of the conductive material traces;
hermetically sealing a cap onto the ceramic substrate wherein the cap covers the semiconductor die and the proximal ends of the conductive material traces, leaving exposed the distal ends of the traces and the lead holes;
placing leads into the lead holes in a position perpendicular to the conductive metal traces after the cap is hermetically sealed to the substrate; and
soldering the leads in the lead holes to the distal ends of the conductive material traces,
in the absence of a plastic encapsulation step.

18. The process of claim 17 wherein the leads have lead ends, and the leads are placed into the lead holes such that the lead ends are on the same side of the substrate as the semiconductor die.

19. The process of claim 17 wherein the leads have lead ends and socket holes in opposite ends thereof for receiving the lead ends from another package.

* * * * *